(12) United States Patent
Nacev

(10) Patent No.: US 10,534,053 B2
(45) Date of Patent: Jan. 14, 2020

(54) METHOD AND APPARATUS FOR HIGH SLEW RATE SINGLE POINT MAGNETIC RESONANCE IMAGING OF MAGNETIZABLE NANOPARTICLES

(71) Applicant: Weinberg Medical Physics, Inc., North Bethesda, MD (US)

(72) Inventor: Aleksandar Nelson Nacev, Bethesda, MD (US)

(73) Assignee: Weinberg Medical Physics, Inc.MD (US)

( * ) Notice: Subject to any disclaimer, the term of this patent is extended or adjusted under 35 U.S.C. 154(b) by 98 days.

(21) Appl. No.: 15/352,164

(22) Filed: Nov. 15, 2016

(65) Prior Publication Data

US 2017/0139024 A1    May 18, 2017

Related U.S. Application Data

(60) Provisional application No. 62/255,843, filed on Nov. 16, 2015.

(51) Int. Cl.
| | | |
|---|---|---|
| *G01R 33/44* | (2006.01) | |
| *G01R 33/34* | (2006.01) | |
| *G01R 33/50* | (2006.01) | |
| *G01R 33/385* | (2006.01) | |
| *G01R 33/48* | (2006.01) | |

(52) U.S. Cl.
CPC ................. *G01R 33/4824* (2013.01)

(58) Field of Classification Search
CPC .................. G01R 33/4824; G01R 33/4816
See application file for complete search history.

(56) References Cited

U.S. PATENT DOCUMENTS

| | | | | |
|---|---|---|---|---|
| 2002/0153889 A1* | 10/2002 | Garwood | ........... | G01R 33/4616 324/307 |
| 2008/0097189 A1* | 4/2008 | Dumoulin | .............. | A61B 5/055 600/410 |
| 2008/0218506 A1* | 9/2008 | Doyle | ................. | G01R 33/5611 345/418 |
| 2011/0181284 A1* | 7/2011 | Balcom | ................. | G01R 33/243 324/309 |
| 2013/0234708 A1* | 9/2013 | Goora | .............. | G01R 33/56572 324/309 |

* cited by examiner

*Primary Examiner* — Christopher P McAndrew
*Assistant Examiner* — Zannatul Ferdous
(74) *Attorney, Agent, or Firm* — Barnes & Thornburg LLP

(57) ABSTRACT

Apparatuses and methodologies are provided that utilize at least one polarizing magnet controlled and positioned to polarize spins in a first region of interest, at least one gradient coil controlled and positioned to generate phase-encoding gradient pulses within a second region of interest, and at least one radiofrequency coil controlled and positioned to acquire radiofrequency signals from the second region of interest, wherein the at least one gradient coil and at least one radiofrequency coil may be controlled such that application of phase-encoding gradient pulses stops before acquisition of radiofrequency signals.

10 Claims, 4 Drawing Sheets

METHOD AND APPARATUS FOR HIGH SLEW RATE SINGLE POINT MAGNETIC RESONANCE IMAGING OF MAGNETIZABLE NANOPARTICLES

CROSS REFERENCE AND PRIORITY CLAIM

This patent application claims priority to U.S. Provisional Application 62/255,843 filed Nov. 16, 2015, the disclosure of which being incorporated herein by reference in its entirety.

FIELD OF USE

Disclosed embodiments enable magnetic resonance imaging using magnetizable nanoparticles.

BACKGROUND

Single point imaging is a subset of volumetric imaging techniques within the discipline of magnetic resonance imaging as taught by S. Subramanian et. al. entitled "Single-Point (Constant-Time) Imaging in Radiofrequency Fourier Transform Electron Paramagnetic Resonance" published in Magnetic Resonance in Medicine. It typically contains three main components (see FIG. 1): 1) a broadband radio frequency (RF) excitation pulse (100) that excites a polarized species (110 or 120); 2) at least one gradient pulse that adds a phase dispersion across the sample (130 and 140); and 3) an acquisition window that measures radio frequencies near to the Lamour frequencies of the excited sample (150).

FIG. 1 illustrates a typical single point imaging pulse sequence. A broadband or slice selective RF pulse, 100, excites the spins of a polarized species. These species can have various T2 decay times as illustrated by species 110 having a quicker decay time compared to species 120. Usually but not limited to after the RF pulse, a phase encoding gradient 130 and 140 may be applied in at least one or a multitude of directions. After a delay, the signal from the decaying signal is acquired by using a RF coil in the time window as shown by 150. During this acquisition time, at least one encoding gradient is still active.

Single point imaging can be used to image materials with very short T2* decay times (approximately less than 300 microseconds as illustrated by 110); however, it has also been used as a technique to improve image signal to noise, and reduce field inhomogeneity artifacts. The inherent tradeoff to this imaging sequence is the large amount of time needed to image the entire k-space region compared to the quick imaging time of echo planar imaging, fast gradient echo sequences, or fast spin echo sequences.

Single point imaging schemes may be used to image materials with very fast T2-decay times such as dense solids because the minimum echo time can be close to zero. This short echo time further enables the ability to use such pulse sequences to image magnetic nanoparticles. Introduction of such magnetic materials may decrease the T2*-decay time of the surrounding media, e.g., by dephasing a surrounding water signal by the time that conventional imaging sequences take to acquire data. Other pulse sequence strategies, such as sweep imaging with Fourier transform (as taught by C. Corum, et. al in the article entitled "Introduction to SWIFT (Sweep Imaging with Fourier Transformation) for Magnetic Resonance Imaging of Materials" published in the Materials Research Society Symposium Proceedings), have been employed to visualize both solid and metallic structures but these require complex pulse sequence shapes and swept radiofrequency transmission schemes.

To ease hardware requirements and decrease acoustic noise, the most common variants of single point imaging schemes have a constantly powered magnetic gradient that is ramped through the entire range of applied gradient strengths over the imaging sequence. These have been termed single point ramped imaging with T1-enhancement or SPRITE imaging and are discussed by M. Halse et al. in a paper entitled "Centric scan SPRITE magnetic resonance imaging" published in Journal of Magnetic Resonance or by C. Kennedy, et. al. in a paper entitled "Three-dimensional magnetic resonance imaging of rigid polymeric materials using single-point ramped imaging with T1 enhancement (SPRITE)" published in the Canadian Journal of Chemistry. While SPRITE imaging schemes decrease eddy currents within the sample, decrease acoustic noise, and relax the requirements on the gradient hardware, SPRITE has a similar tradeoff that to traditional single point imaging strategies: the encoding gradients remain powered during at least part of the signal acquisition window causing increased dephasing of the signal during the entire readout window.

SUMMARY

Disclosed embodiments provide an apparatus and method for magnetic resonance imaging.

An apparatus provided in accordance with at least one of the disclosed embodiments includes at least one polarizing magnet controlled and positioned to polarize electron spins in a first region of interest, at least one gradient coil controlled and positioned to generate phase-encoding gradient pulses within a second region of interest, and at least one radiofrequency coil controlled and positioned to acquire radiofrequency signals from the second region of interest. A corresponding method is provided to perform the above-identified functionality of the disclosed apparatus.

In accordance with at least one of the disclosed embodiments, the at least one gradient coil and at least one radiofrequency coil may be controlled such that application of phase-encoding gradient pulses stops before acquisition of radiofrequency signals.

In accordance with at least one of the disclosed embodiments, at least one of the phase-encoding gradient pulses has a magnitude higher than 100 mT/m, and a rise-time or fall-time of less than 100 microseconds.

In accordance with at least one of the disclosed embodiments, the first region of interest and second region of interest may be the same region or different regions.

Disclosed embodiments may utilize a polarization magnet comprised of one or more permanent magnets, electromagnets, super conducting magnets, or electropermanent magnets to excite the spins of hydrogen protons and/or various nuclear species (e.g. fluorine-19) so as to polarize, excite, and/or image electrons.

In accordance with at least one embodiment, a hyperpolarized species having been polarized in a prior location or by a prior activity can be imaged within an imaging volume.

BRIEF DESCRIPTION OF THE FIGURES

The detailed description particularly refers to the accompanying figures in which.

DETAILED DESCRIPTION

Disclosed embodiments utilize a polarization magnet comprised of one or more permanent magnets, electromagnets, super conducting magnets, or electropermanent magnets to excite the spins of hydrogen protons and/or various nuclear species (e.g. fluorine-19) so as to polarize, excite, and/or image electrons.

At least one embodiment of the present invention consists of a polarization magnet comprised of one or more permanent magnets. However, it is understood that the polarization magnet can be composed of any combination of one or more permanent magnets, electromagnets, super conducting magnets, or electropermanent magnets (as described in the provisional patent by A. Nacev and I. N. Weinberg entitled "Method and apparatus for manipulating electropermanent magnets for magnetic resonance imaging and image guided therapy").

Figure 1:
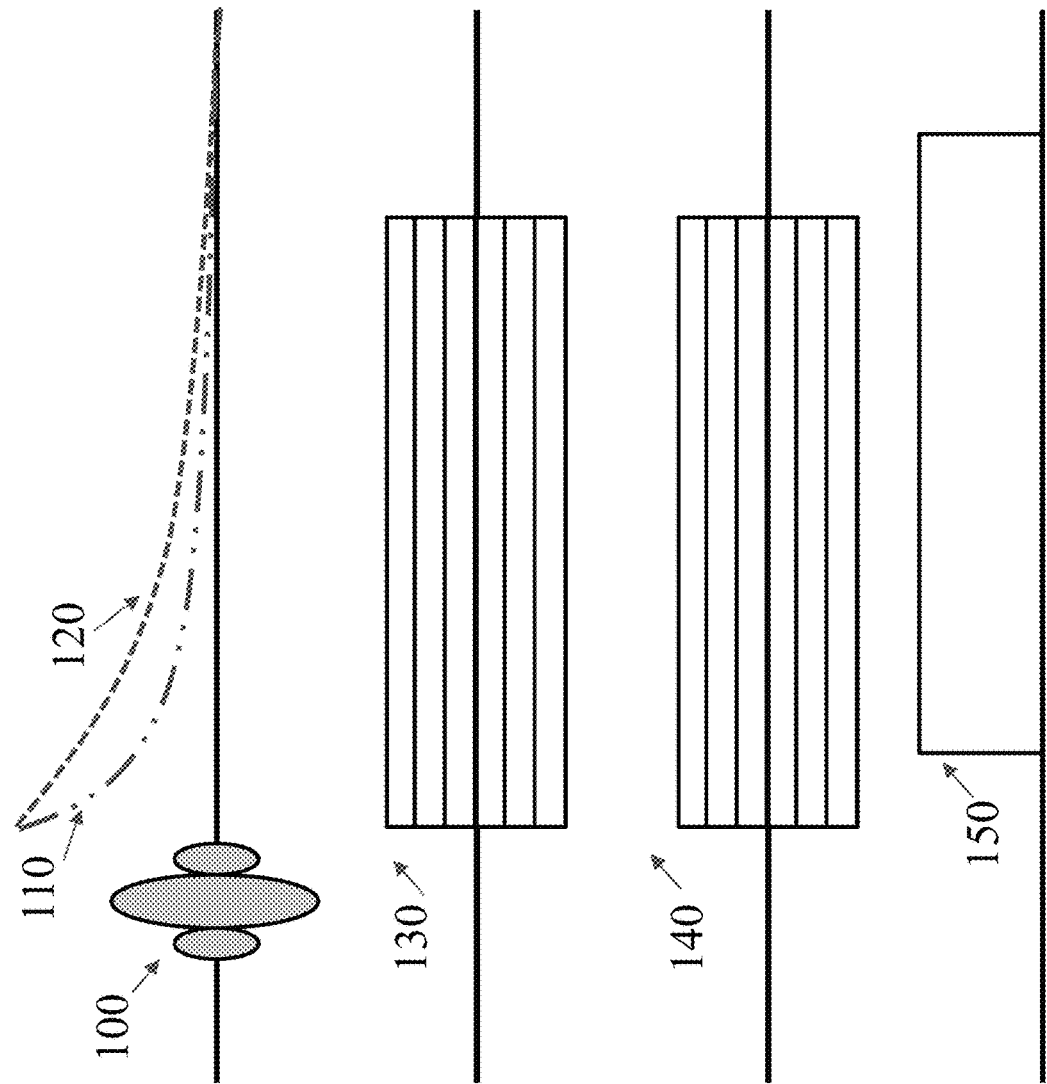
FIG. 1 illustrates a conventionally known single point imaging pulse sequence.
Figure 2:
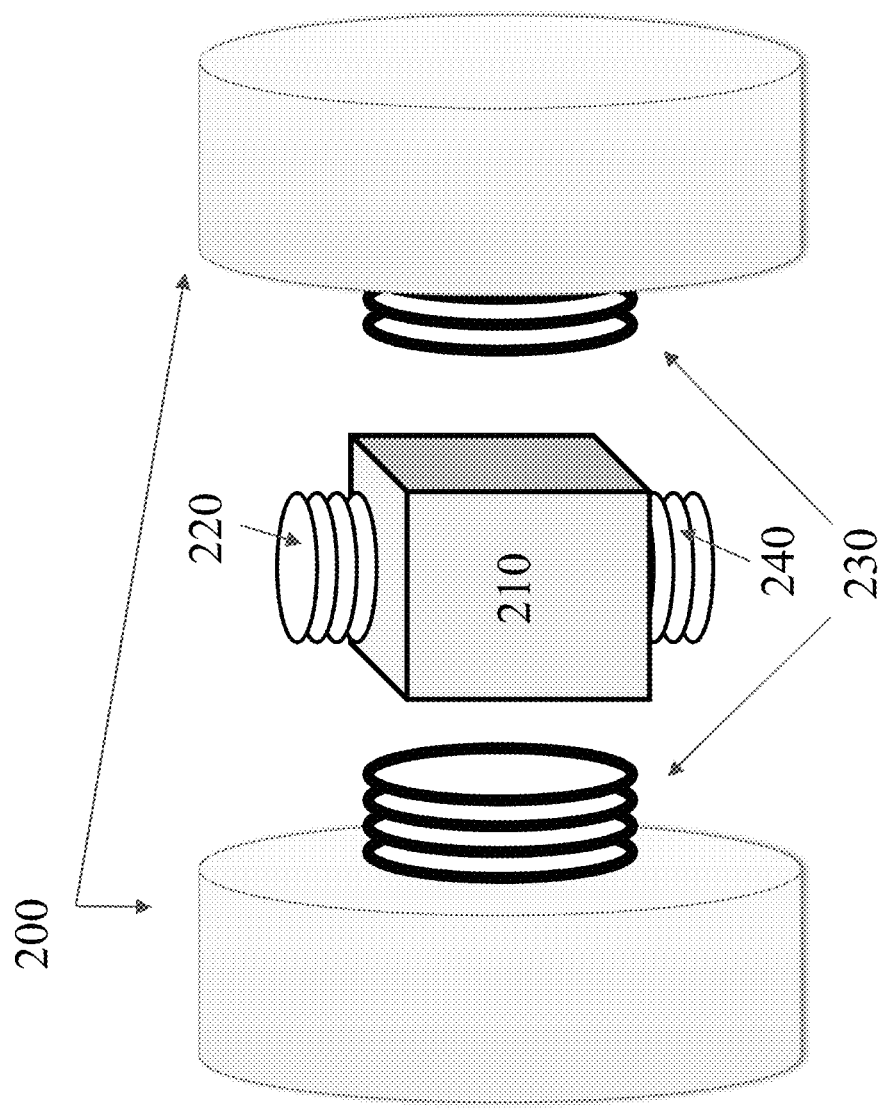
FIGS. 2 and 3 illustrate an example of a disclosed embodiment of an apparatus for single point imaging.

As illustrated in FIG. 2, an example of an apparatus designed in accordance with a least one embodiment includes a polarization magnet 200. For the purpose of this specification, a polarizing magnet includes, for example, a device that creates a magnetic field that applies a polarization to the proton spins of an object found within a region of interest 210, a radio frequency (RF) coil 220 that applies an excitation to the spins of an object, at least one gradient coil 230 which encodes a phase distribution across the spins of the object, and an RF coil 240 for receiving the encoded spin information from the object. The apparatus applies a phase encoding within the region of interest 210 wherein at least one gradient begins to encode after the application of the radiofrequency pulse but before the acquisition of the radio frequency signal.

For the purposes of this disclosure, the region of interest 210 may be defined as including volumetric space in which a user may obtain images and/or manipulate magnetizable materials (for example, particles). For the purposes of this specification the phrase "imaging within a region of interest" should be understood to encompass use of the electrical or magnetic properties of materials in that region of interest to provide information about the location or state of those materials. Examples of "imaging within a region of interest" includes magnetic resonance imaging, magnetic particle imaging, or other methods. These images may be obtained using magnetic resonance imaging of nuclei, electrons or other materials or via magnetic particle imaging. The region of interest can be a single volumetric space or be composed of multiple volumes which may or may not be contiguous.

For the purposes of this disclosure, the term "phase encoding" refers to the application of a magnetic field or electrical field that preferentially changes the Larmor spin frequency within the region of interest for a prescribed amount of time. In accordance with at least one disclosed embodiment, such encoding can be applied in a linear distribution within the region of interest; however, likewise, the encoding can be applied in a non-linear distribution as well/instead. It should also be understood, that the encoding can be generated by secondary effects within the region of interest including but not limited to pH changes in the object, chemical shift artifacts due to different molecular species, and magnetizable materials.

Figure 3:
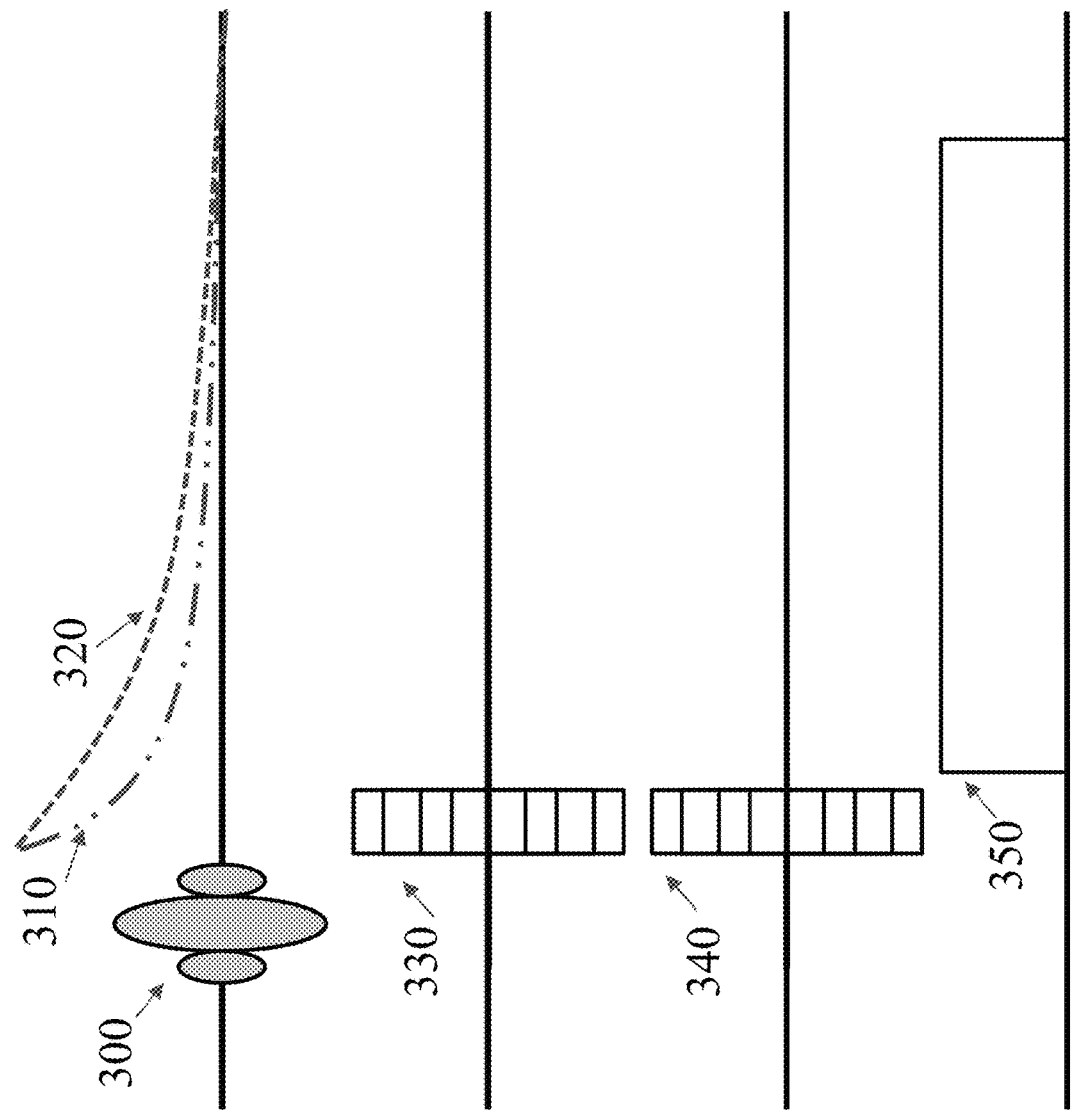

FIG. 2 and FIG. 3 illustrate how disclosed embodiments may provide implementation of an apparatus and a methodology. For the purposes of this disclosure, the RF coils 220 and 240 are shown separately in order to more clearly describe separate functions. However, it is understood that these RF coils may not be separate from each other, and that a single RF coil may have multiple functions. In addition, it is understood that a multitude of RF coils may comprise an array that when working in tandem generate and/or acquire RF signals for at least one polarized species.

As shown in FIG. 2, a polarizing magnet 200 causes an initial polarization to the spins of protons within a region of interest 210. A transmitting RF coil 220 excites the polarized spins using a broadband or spatially selective RF pulse 300 as illustrated in FIG. 3. For the purposes of this disclosure, gradient coils 330 and 340 are shown separately in order to more clearly describe separate functions It is understood that the gradient coils may not be separate, and that one or more gradient coils may have multiple functions. In addition, these gradient coils may be combined with a RF coil and/or another coil providing a spin polarization.

The species that are excited can have a quick T2 decay time similar to 310 or have a longer decay time similar to 320. Subsequent to RF excitation one or more encoding gradients 230 are activated 330 and 340 to create a phase dispersion within the imaging volume 210. After encoding, the gradients 230 are deactivated and a receiving RF coil 240 acquires encoded signal from the excited spins during the time window 350.

Disclosed embodiments, for example, as illustrated in FIG. 3, differ from the prior art in that for the present invention at least one gradient coil (whose gradient currents are illustrated in 330 and/or 340) is not active (i.e., not still phase encoding) while the RF receive coil is active 350. By halting phase encoding while a RF coil is recording signal from the polarized species, 350, the polarized species will no longer accumulate any additional phase dispersion. Therefore, the measured RF signal will only gain phase dispersion due to field inhomogeneity T2* effects. This means that the effective voxel size of the analyzed signal will remain constant during the entire RF acquisition. Due to the constant resolution of all time points in the measured RF signal, the time series of images generated from the reconstructing the measured single point imaging data corresponds to the exact same resolution of the object. This method allows for easy comparisons of time series data and potentially higher signal to noise values throughout the entire time series imaging data.

Apparatuses and methodologies provided in accordance with disclosed embodiments differ in operation from the prior art by applying magnetic gradient pulses with very short durations (for example, between 10 and 200 microseconds), and/or switching the gradients on and/or off quickly (for example, between 10 and 100 microseconds). The quickly actuated short gradient pulses (see 330 and 340) allow for polarized species to be imaged very quickly after an RF excitation pulse (e.g. with very short TE times). Since some species (e.g. teeth or the water around magnetizable particles) typically have signals that decay at time scales comparable to 200 microseconds, traditional magnetic resonance scanners cannot directly measure these signals. However, by applying the magnetic gradients quickly and acquiring the RF signal at a short TE time (<200 microseconds), the signal from the polarized species can be measured quickly allowing for fast decaying species to be imaged.

These very fast magnetic gradients have not been previously used in pulse sequences for human MRI, because the community of MRI users (including regulatory authorities) believed that undesired nerve stimulation would occur. As disclosed in prior inventions by I. N. Weinberg in U.S. Pat. No. 8,154,286 and patents related by priority claims and commonly assigned with the present application (all of which being incorporated herein by reference), it is possible to avoid causing nerve stimulation by utilizing very fast gradients, even when the magnitudes of the gradient pulses are high (for example, between 100 mT/m and 1 T/m).

Figure 4:
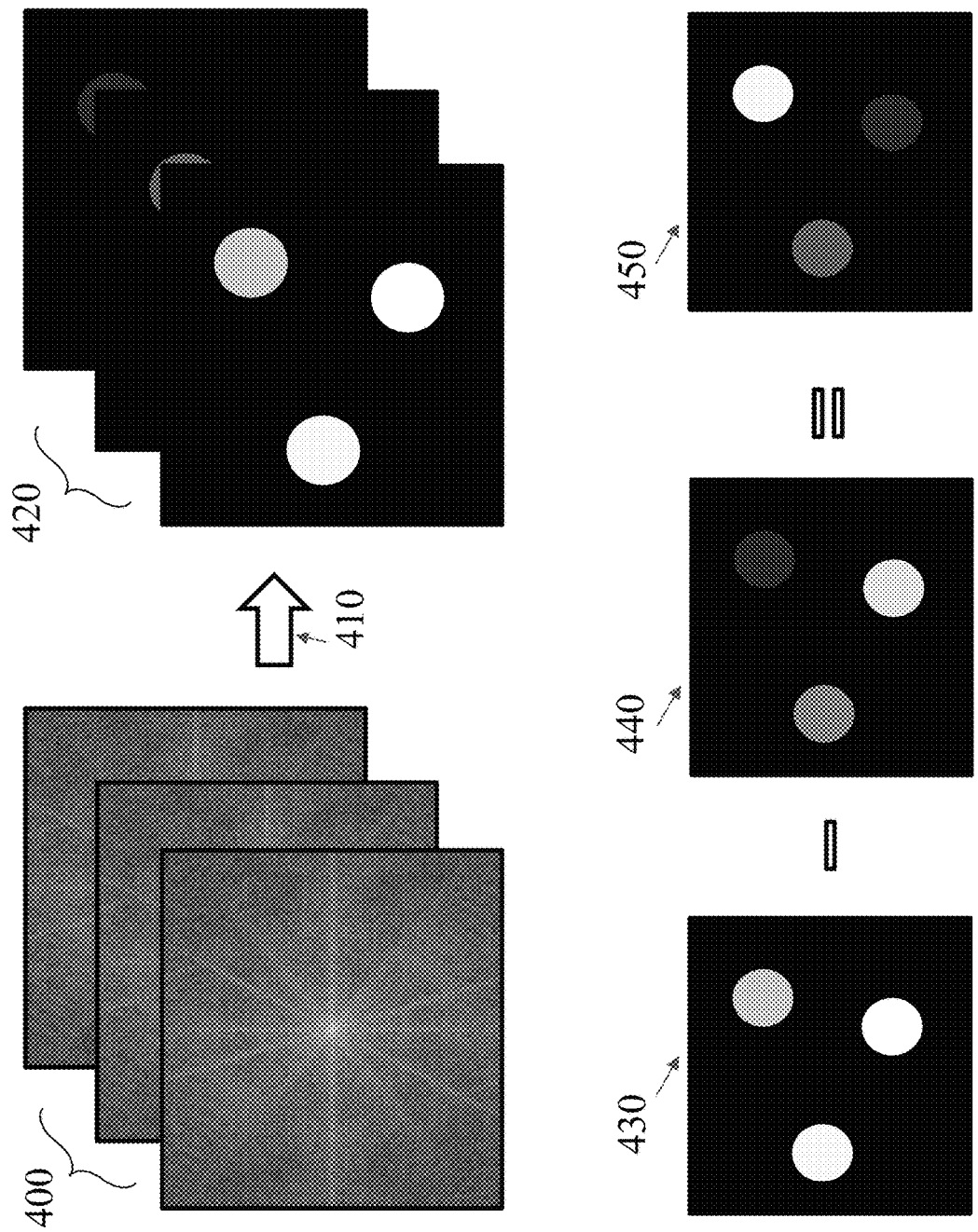
FIG. 4 illustrates one example of a method provided in accordance with the disclosed embodiment to extract information regarding spatial localization of species containing a short T2 decay time compared to the anatomical information.

FIG. 4 details one example of a method to extract information regarding spatial localization of species containing a short T2 decay time compared to the anatomical information in accordance with disclosed embodiments. After acquisition of all encoding gradients, the signal information may be arranged by time and encoding strengths as shown in 400. After an image transformation 410 (e.g. Fourier transform), time series images with similar resolutions are acquired 420. The earliest of these images 430 correspond to a case where very little T2 signal decay is observed and most anatomical detail is retained. Images corresponding to a later time 440 have regions where the signal from species containing a short T2 time has decayed. By comparing an image taken from earlier time with an image taken from a later time, the resultant image 450 illustrates the location of a species with short T2 times.

Magnetizable particles often cause short signal decay times, so the present invention is useful for imaging such particles. For the purposes of this disclosure, the term "magnetic materials" is intended to include small structures which contain magnetizable materials (for example, iron-containing particles ranging in maximal diameter from 1 nm to 1 mm) or larger structures containing magnetizable materials (for example, iron-containing objects ranging in size from 1 cm to 1 m). By taking a time series of images 420 with a constant spatial resolution and with a short TE time, the polarizations of various quickly decaying species can be visualized in a pixel by pixel manner. Therefore, a direct comparison of the images from an earlier time 430 to a later time 440 will inform the viewer as to which pixels contain a species that have a short TE time 450. The early images 430 represent the object before substantial signal decay occurs, and therefore is a representation of the anatomy of the object with minimal or no effect from the presence of the particles ("unaffected anatomic image"). Images from later 440 in the pulse sequence represent the effect of the particles ("magnetic material image"). Thus, a composite image 450 is formed which superimposes information about the distribution and effect of one or more magnetic particles upon an image of the object's anatomy. This innovation represents an improvement on other forms of magnetic particle imaging, which do not display the unaffected anatomic image.

In accordance with at least one embodiment, the spins of hydrogen protons may be excited. For the purposes of this disclosure, the term "spin" is used to denote the property of a particle or set or particles that can be polarized by a magnetic field. Examples of such particles include such as a proton, electron, and several types of atomic nuclei (for example fluorine-19). Examples of sets of such particles include iron oxide nanorods. It should also be understood that a hyper-polarized species that may have been polarized in a prior location within a region of interest (e.g., a first region of interest) or by a prior activity outside the region of interest can be imaged within an imaging volume in the first region of interest or in a second region of interest. For the purposes of this disclosure, the first and second regions of interest can be identical or can be overlapping. It is understood that the term "second region of interest" is used to describe at least one region of interest but can also include third, fourth or in general many additional regions of interest.

It should be understood that the operations explained herein may be implemented in conjunction with, or under the control of, one or more general purpose computers running software algorithms to provide the presently disclosed functionality and turning those computers into specific purpose computers.

Moreover, those skilled in the art will recognize, upon consideration of the above teachings, that the above exemplary embodiments may perform the above-specified operations (and those referred in the claims) under the control of at least one controller that may utilize or be based upon use of one or more programmed processors programmed with a suitable computer program. However, the disclosed embodiments could utilize one or more controllers implemented using hardware component equivalents such as special purpose hardware and/or dedicated processors. Similarly, general purpose computers, microprocessor based computers, micro-controllers, optical computers, analog computers, dedicated processors, application specific circuits and/or dedicated hard wired logic may be used to construct alternative equivalent embodiments.

Moreover, it should be understood that control and cooperation of components of an instrument for applying magnetic fields described herein to manipulate one or more particles may be provided using software instructions that may be stored in a tangible, non-transitory storage device such as a non-transitory computer readable storage device storing instructions which, when executed on one or more programmed processors, carry out the above-described method operations and resulting functionality. In this case, the term non-transitory is intended to preclude transmitted signals and propagating waves, but not storage devices that are erasable or dependent upon power sources to retain information.

Accordingly, such an instrument may include one or more controllable electromagnetic field sources and a controller that enables control of resulting magnetic fields as described herein. In one such implementation, one or more gradient coils may be utilized under the control of a controller to enables control of the gradient to produce one or magnetic fields using at least one coil driver, wherein one or more coils are provided for transmitting RF energy into a tissue sample of a body part as part of diagnostic, prognostic, and/or treatment.

Those skilled in the art will appreciate, upon consideration of the above teachings, that the program operations and processes and associated data used to implement certain of the embodiments described above can be implemented using disc storage as well as other forms of storage devices including, but not limited to non-transitory storage media (where non-transitory is intended only to preclude propagating signals and not signals which are transitory in that they are erased by removal of power or explicit acts of erasure) such as for example Read Only Memory (ROM) devices, Random Access Memory (RAM) devices, network memory devices, optical storage elements, magnetic storage elements, magneto-optical storage elements, flash memory, core memory and/or other equivalent volatile and non-volatile storage technologies without departing from certain embodiments of the present invention. Such alternative storage devices should be considered equivalents.

While certain illustrative embodiments have been described, it is evident that many alternatives, modifications, permutations and variations will become apparent to those skilled in the art in light of the foregoing description. While illustrated embodiments have been outlined above, it is evident that many alternatives, modifications and variations will be apparent to those skilled in the art. Accordingly, the various embodiments of the invention, as set forth above, are intended to be illustrative, not limiting. Various changes may be made without departing from the spirit and scope of the invention.

As a result, it will be apparent for those skilled in the art that the illustrative embodiments described are only examples and that various modifications can be made within the scope of the invention as defined in the appended claims.

The invention claimed is:

1. An apparatus for magnetic resonance imaging, the apparatus comprising:
    at least one polarizing magnet controlled and positioned to polarize spins in a first region of interest;
    at least one gradient coil controlled and positioned to generate phase-encoding gradient pulses within a second region of interest; and
    at least one radiofrequency coil controlled and positioned to acquire radiofrequency signals from the second region of interest,
    wherein the at least one gradient coil and at least one radiofrequency coil are controlled such that application of phase-encoding gradient pulses stops before acquisition of radiofrequency signals,
    wherein at least one of the phase-encoding gradient pulses has a magnitude higher than 100 mT/m, and a rise-time or fall-time of less than 100 microseconds, and
    wherein the first region of interest and second region of interest is one of the same region or different regions.

2. The apparatus of claim 1, in which operation of the at least one polarizing magnet and the at least one gradient coil are controlled such that no nerve stimulation occurs within a subject's body within the first and/or second regions of interest.

3. The apparatus of claim 1, where the region of interest contains magnetizable material.

4. The apparatus of claim 1, where multiple separate coil functions is carried out by one coil.

5. A method of collecting magnetic resonance images, the method comprising:
    controlling at least one polarizing magnet to polarize spins in a first region of interest;
    controlling at least one gradient coil to generate phase-encoding gradient pulses within a second region of interest; and
    controlling at least one radiofrequency coil controlled and positioned to acquire radiofrequency signals from the second region of interest,
    wherein the at least one gradient coil and at least one radiofrequency coil are controlled such that application of phase-encoding gradient pulses stops before acquisition of radiofrequency signals,
    wherein at least one of the phase-encoding gradient pulses has a magnitude higher than 100 mT/m, and a rise-time or fall-time of less than 100 microseconds,
    wherein the first region of interest and second region of interest is one of the same region or different regions, and
    wherein the at least one of least one of the phase-encoding gradient pulses has a duration of 10-200 microseconds.

6. The method of claim 5, further comprising performing image processing on the acquired radiofrequency signals to create a set of images, wherein each image of the set of images corresponds to a radio frequency signal acquired at a different time after the cessation of at least one gradient pulse.

7. The method of claim 5, further comprising performing image processing on the acquired radiofrequency signals to create a set of images, wherein at least one image of the set of images represents unaffected anatomy within a subject's body within the second region of interest and at least one image of the set of images represents distribution of magnetizable material within a subject's body within the second region of interest.

8. The method of claim 5, further comprising performing image processing on the acquired radiofrequency signals to create a set of images, wherein at least one image of the set of images is a composite image that includes representation of an unaffected anatomy within a subject's body within the second region of interest as well as representation of distribution of magnetizable material within a subject's body within the second region of interest.

9. The apparatus of claim 1, wherein the acquired radiofrequency signals are phase-encoded only.

10. The apparatus of claim 1, wherein the at least one of least one of the phase-encoding gradient pulses has a duration of 10-200 microseconds.

* * * * *